United States Patent [19]
Noll et al.

[11] Patent Number: 5,311,132
[45] Date of Patent: May 10, 1994

[54] METHOD OF ENHANCING THE FOCUS OF MAGNETIC RESONANCE IMAGES

[75] Inventors: Douglas C. Noll, Pittsburgh, Pa.; John M. Pauly; Albert Macovski, both of Menlo Park, Calif.

[73] Assignee: The Board of Trustees of the Leland Stanford Junior University, Stanford, Calif.

[21] Appl. No.: 920,959

[22] Filed: Jul. 28, 1992

[51] Int. Cl.$^5$ .............................. G01R 33/20
[52] U.S. Cl. ...................... 324/309; 324/307
[58] Field of Search ............ 324/309, 307, 300; 128/653.2

[56] References Cited

U.S. PATENT DOCUMENTS 5,055,789 10/1991 Kondo et al. .................. 324/309

OTHER PUBLICATIONS

Noll, et al., "Automatic De-Blurring for Imaging with Time-Varying Gradients," Book of Abstracts, Society of Mag. Res. in Medicine, 10th Annual Scientific Mtg., Aug. 10-16, 1991, San Francisco, CA.
Noll, et al., "Deblurring for Non-2D Fourier Transform Magnetic Resonance Imaging," Magnetic Resonance in Medicine, vol. 25, No. 2, Jun. 1992, pp. 319-333.

*Primary Examiner*—Michael J. Tokar
*Assistant Examiner*—Raymond Y. Mah
*Attorney, Agent, or Firm*—Townsend and Townsend Khourie and Crew

[57] ABSTRACT

Disclosed is a method for automatically removing blur in magnetic resonance image signals introduced due to inhomogeneity in the magnetic field and variations in magnetic susceptibility of an object being imaged. Detected signals are demodulated at several different frequencies and reconstructed to create a series of base images. The amount of blur is determined by establishing a focusing measure for each point or part in each base image, and a composite image is then constructed using only the unblurred regions from each base image. Focusing criterion can include minimization of the imaginary part of the complex MRI after removal of constant and low frequency phase information.

19 Claims, 12 Drawing Sheets

METHOD OF ENHANCING THE FOCUS OF MAGNETIC RESONANCE IMAGES

MAGNETIC RESONANCE IMAGES

The U.S. government has rights in the invention pursuant to National Institute of Health grants HL34962, HL39478, HL39297, and CA50948.

BACKGROUND OF THE INVENTION

This invention relates generally to magnetic resonance imaging (MRI), and more particularly the invention relates to enhancing the focus of magnetic resonance images.

Magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency, $\omega_0$, of the precession of the nuclei is the product of the magnetic field, $B_0$, and the so-called magnetogyric ratio, $\gamma$, a fundamental physical constant for each nuclear species:

$$\omega_o = B_0 \cdot \gamma$$

The resonant frequency for a particular nucleus in a magnetic field of MR apparatus can vary due to inhomogeneity of the magnetic field and also because the magnetic field varies due to the magnetic susceptibility of the object being imaged.

The present invention is directed to a method of improving the focus of magnetic resonance images obtained using inhomogeneous or varying magnetic fields.

SUMMARY OF THE INVENTION

In accordance with the invention raw data obtained with MRI apparatus is demodulated with a plurality of demodulation frequencies, and images or image signals are formed using the demodulated data signals. Preferably, the demodulation frequencies are approximate Larmor frequencies of nuclei to be imaged. A sharpness or focusing criterion is established for each point or for each part of an object to be imaged. The demodulation or reconstruction frequency of the most in focus image at each point or part is recorded to create a map of the frequency distribution. A reconstruction frequency can then be varied locally or applied to the image globally in forming the image.

The process can be implemented iteratively using focusing criterion for image signals at each point or for each part of the image. In one embodiment, the focusing criterion can be to minimize the imaginary part of the complex image signal after removal of constant or low frequency phase information. Alternatively, the criterion can be to minimize variation in image phase. Other focusing or sharpness criterion can be employed.

The invention and objects and features thereof will be more readily apparent from the following detailed description and appended claims when taken with the drawings.

BRIEF DESCRIPTION OF THE DRAWINGS

FIGS. 12D and 12E illustrate local resonant frequency maps for the phantom.

DETAILED DESCRIPTION OF ILLUSTRATIVE EMBODIMENTS

Figure 1A:
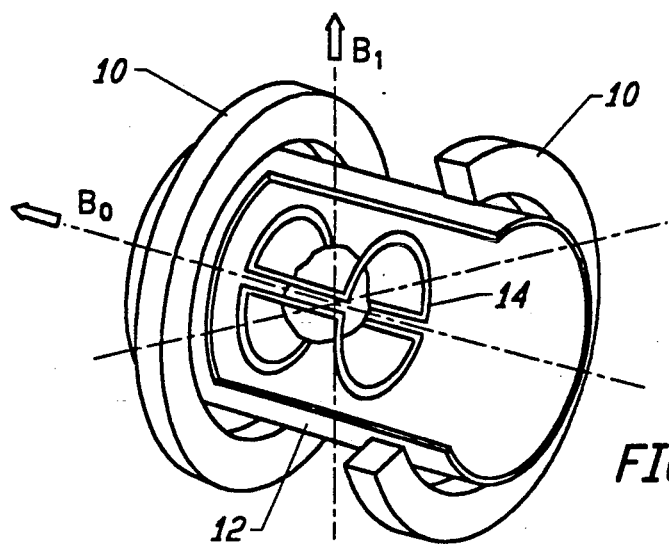
FIGS. 1A–1D illustrate the arrangement of conventional MRI apparatus and magnetic fields generated therein.
Figure 1B:
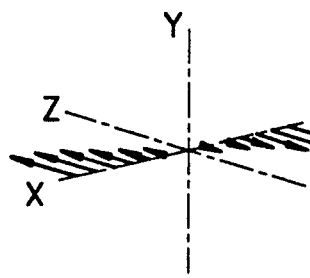
Figure 1C:
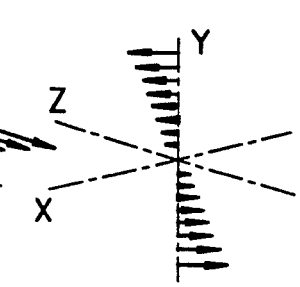
Figure 1D:
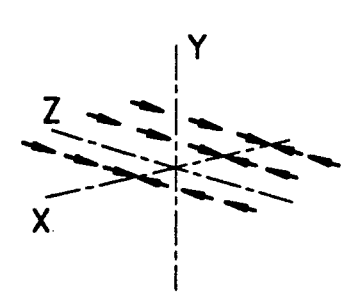

Referring now the drawings, FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, Mar. 1983, pp 338–350. Briefly, the uniform static field $B_0$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the axis but does not vary with distance along the Y or Z axes. FIGS. 1C and 1D are similar representations of the Y gradient and Z gradient fields, respectively.

Figure 2:
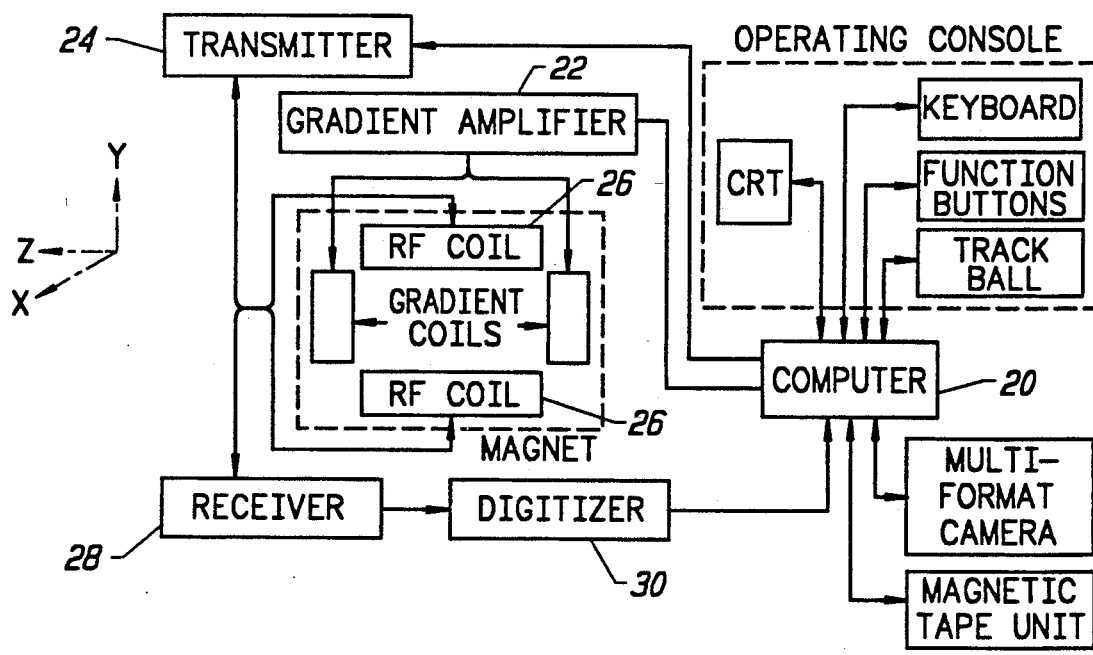
FIG. 2 is a functional block diagram of MRI imaging apparatus.

FIG. 2 is a functional block diagram of the imaging apparatus as disclosed in NMR—A Perspective on Imaging, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

Figure 3:
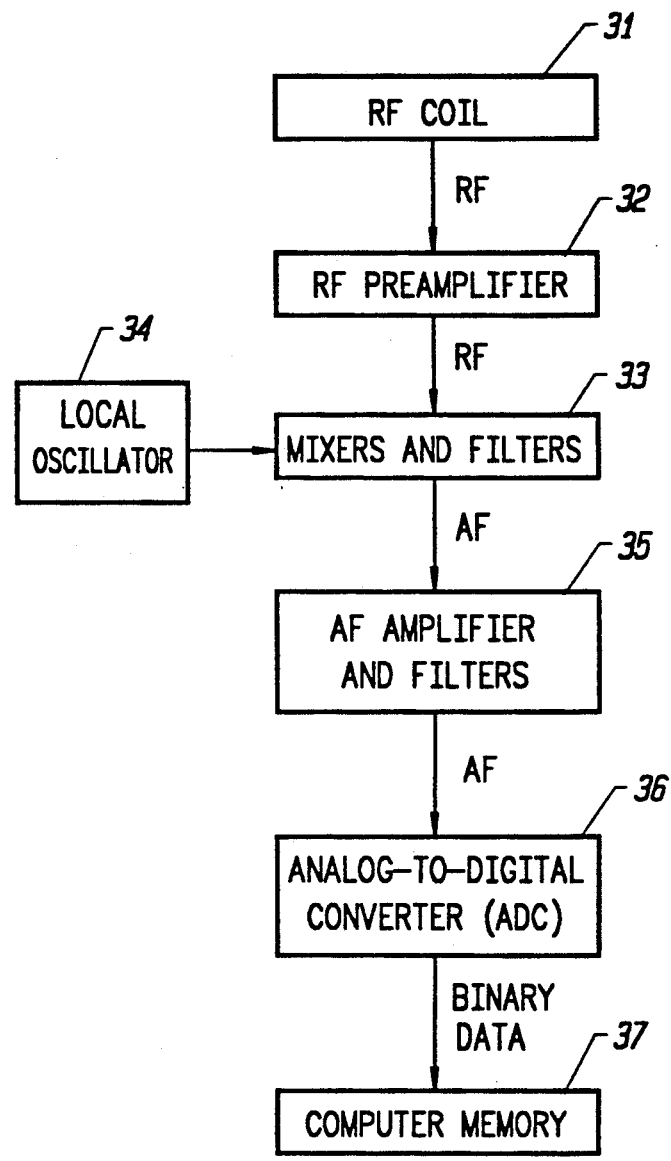
FIG. 3 is a functional block diagram of a magnetic resonance receiver.

FIG. 3 is a block diagram of a magnetic resonance receiver. The RF coil 31 detects resultant signals such as FID signals from nuclei in response to the transverse magnetization. The RF signal, which is approximately at the Larmor frequency, is amplified at 32, and then the amplified RF signal is stepped down in frequency to an audio level in mixer 33 with a local oscillator 34 providing the mixing frequency. Mixer 33 provides a difference frequency between the local oscillator frequency and the RF frequency which is in the audio range. The audio signal is then amplified by amplifier 35, converted from analog to digital format 36, and stored in memory 37.

As noted above, in magnetic resonance imaging, the local magnetic field and hence the resonant frequency can vary because the magnetic field is inhomogeneous and because the magnetic field varies due to magnetic susceptibility of the object being imaged. Conceptually, in accordance with the invention, the frequency of the local oscillator 34, the demodulating frequency, is varied and the image is reconstructed at the several frequencies, as illustrated in the functional block diagram of FIG. 4. This operation is effected in the postprocessing of the detected and recorded signals. When the frequency of the reconstructed image is close to the actual resonant frequency for a part of the image, then that part of the image will be sharp or in focus. In accordance with the invention, focusing criterion is established so that the reconstructions are made automatically. For each point or part of a reconstructed image, a sharpness or focusing criterion is calculated. The reconstructed image which maximizes this criterion is then selected as the best or most focused image for that point as illustrated in FIG. 4.

Figure 4:
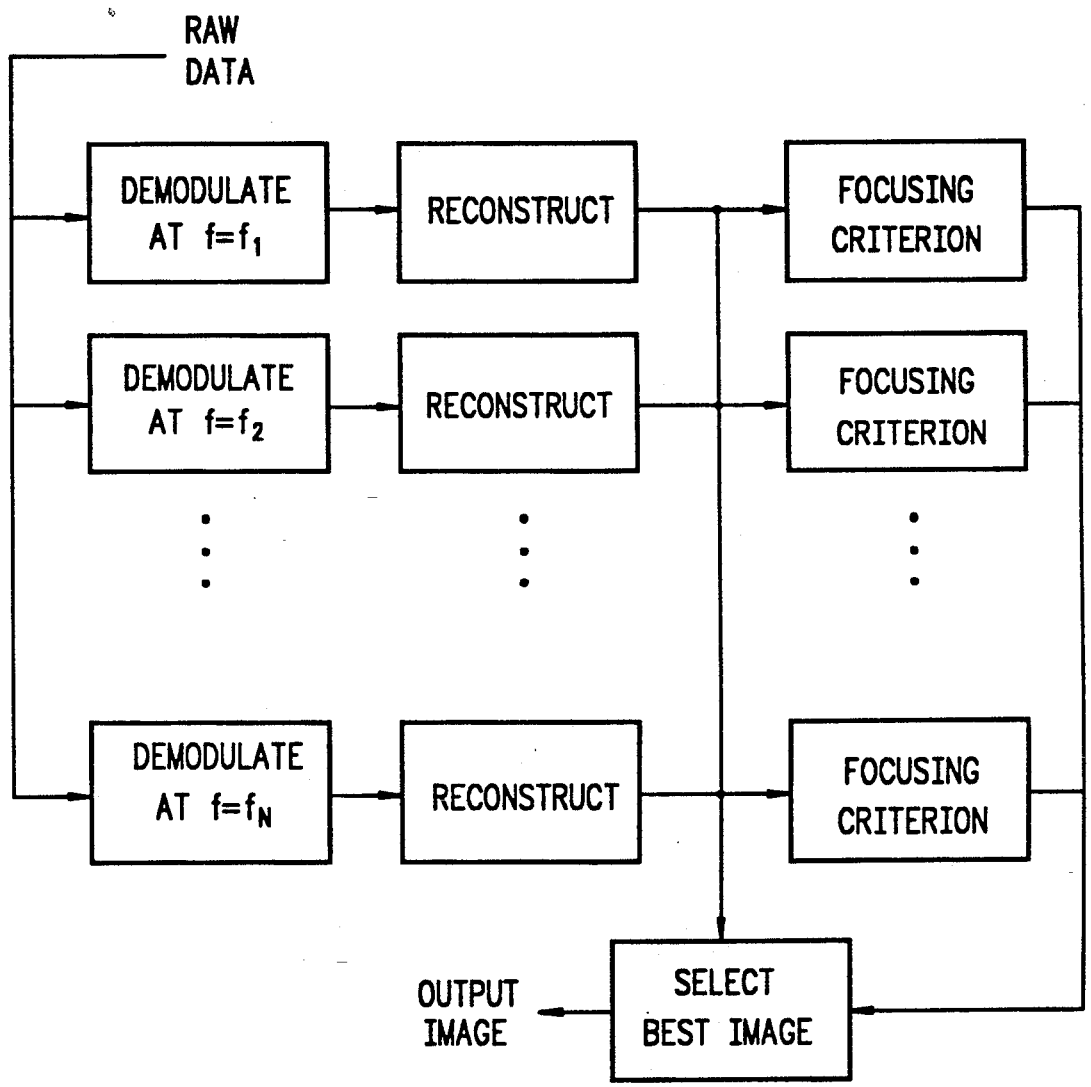
FIG. 4 is a flow diagram illustrating the general method of imaging in accordance with the invention.
Figure 5:
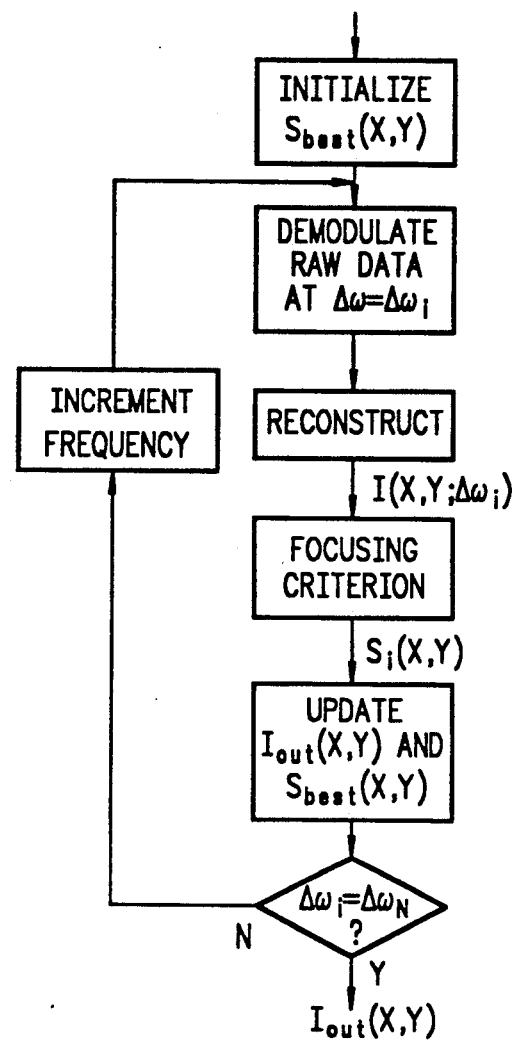
FIG. 5 illustrates a flow diagram of an iterative loop embodiment of the invention.
Figure 6:
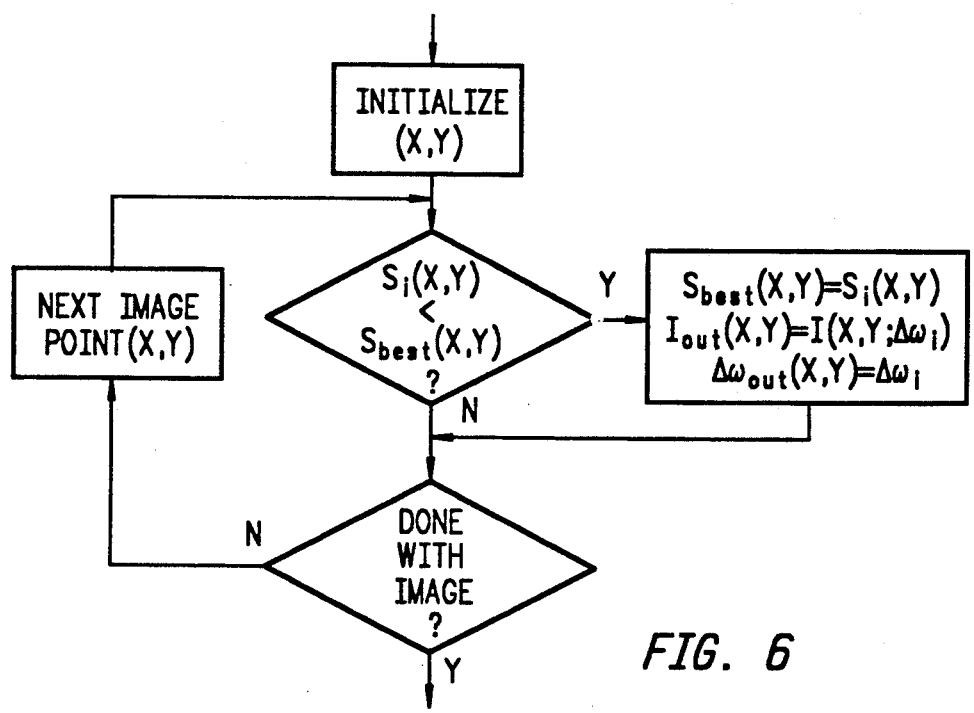
FIG. 6 is a flow diagram further illustrating the focusing criterion $S(x,y)$ and image data $I(x,y)$ update block in FIG. 5.

FIG. 5 is a flow diagram of an iterative process for implementing the method of FIG. 4 in which the image, I (x, y), and the focusing measures, $S_i(x,y)$, are continually updated. FIG. 6 illustrates in more detail the updating functional block of FIG. 5, using processing algorithms presented herein below.

The off-resonant reconstruction can cause image blurring for several non-2DFT imaging methods including projection reconstruction, spiral k-space trajectories, and hybrids of these two. In order to characterize the blurring function, the impulse response, also known as the point spread function, will be determined. Neglecting relaxation and noise, but not neglecting off-resonance effects, the received signal from an excited plane is:

$$s(k_x(t),k_y(t);t) = \int\int m(x,y) e^{-i[k_x(t)\cdot x + k_y(t)\cdot y + \Delta\omega(x,y)t]} dx dy \quad [1]$$

where $m(.)$ is the magnetization and time t is referenced to the center of the excitation pulse. The k-space location is defined by:

$$k_x(t) = \gamma \int_0^t G_x(\xi) d\xi \quad [2]$$

$$k_y(t) = \gamma \int_0^t G_y(\xi) d\xi \quad [3]$$

where $G_x(.)$ and $G_y(.)$ are the time-dependent gradient magnetic fields. This received signal is sampled, and each sample is at some k-space location $(k_x,k_y)$ and has some corresponding collection time $t(k_x,k_y)$.

We will first calculate an impulse response for the spatially invariant case of $\Delta\omega(x,y) = \Delta\omega_0$, a constant. The impulse response is now determined by setting the object equal to the Dirac delta function (12), $m(x,y) = \delta(x,y)$. The received signal is now:

$$S_\delta(k_x(t),k_y(t);t) = e^{-i\Delta\omega_0 t}. \quad [4]$$

As an example, we examine an idealized projection-reconstruction system with infinite slew rate gradients and in which the k trajectory starts at the center of k space and proceeds outward in straight lines. The k space locations as a function of time might then be described as:

$$k_\rho(t) = \gamma(t - t_0) G_0, \quad [5]$$

where $$k_\rho(t) = \sqrt{k_x^2(t) + k_y^2(t)},$$

$G_0$ is the readout gradient strength, and $t_0$ is the time of the first sample at the origin of k space. Since the samples of the received signal correspond to k-space locations, an equation for k space can be found by substituting the known relationship between $k_\rho$ and t (Equation 5) into Equation 4:

$$M(k_x,k_y) = M(k_\rho) = s_\delta(k_\rho) = e^{-i\Delta\omega_0 t_0} e^{-i\Delta\omega_0 \frac{k_\rho}{\gamma G_0}}. \quad [6]$$

The term $$e^{-i\Delta\omega_0 t_0}$$

is a constant phase term that represent the phase accrual due to off-resonance prior to the first sample, and the term $$e^{-i\Delta\omega_0 \frac{k_\rho}{\gamma G_0}}$$

varies radially in k space and represents the phase accrual during data acquisition. The impulse response is just the Fourier transform of this k-space function:

$$h(x,y) = \mathcal{F}_{2D}\{M(k_x,k_y)\}. \quad [7]$$

Figure 7A:
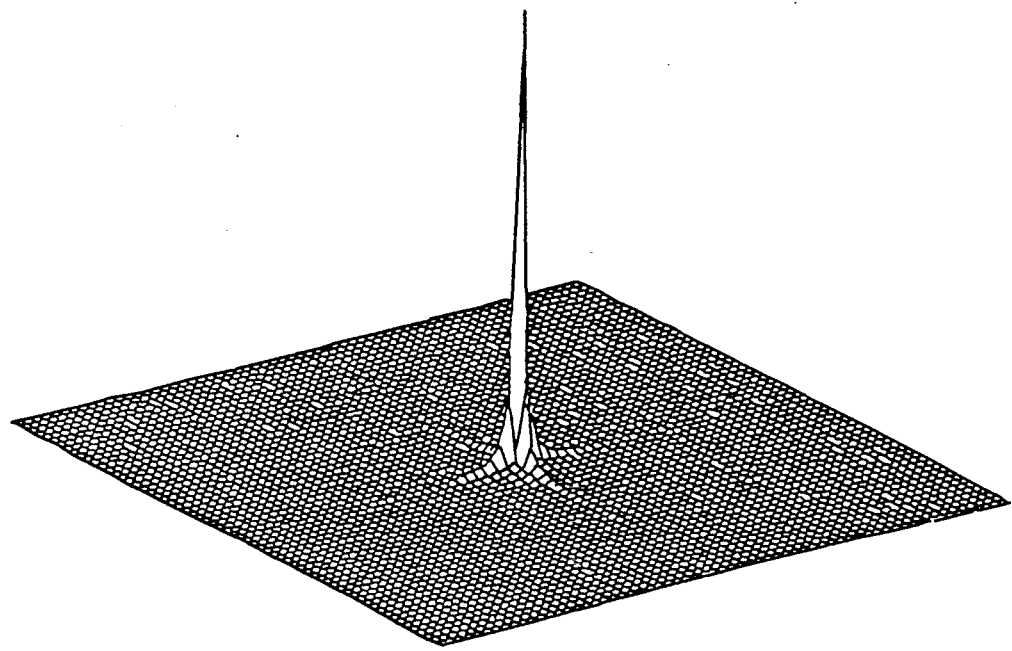
FIGS. 7A, 7B illustrate an impulse response on-resonance and off-resonance, respectively.
Figure 7B:
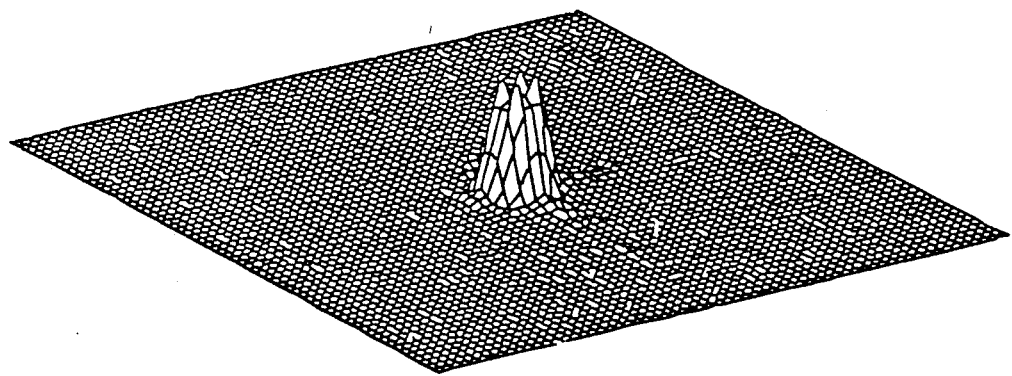

This function does not have a simple analytical expression, but simulated impulse responses were calculated and are found in FIGS. 7A,7B for $\Delta\omega_0=0$ and $\Delta\omega_0=4\pi/T$, where $T=k_{max}/(\gamma G_0)$ is the length of the data acquisition window.

An important consequence of local space invariance is that any point in the image can be placed in focus by tuning the receiver to the proper frequency. This can also be done as part of the reconstruction by modulating the received signal to the appropriate frequency:

$$s(k_x(t),k_y(t);t)e^{i\Delta\omega_0 t} \quad [8]$$

where the modulation frequency is $\Delta\omega_0$. In the case of an impulse object and an idealized projection reconstruction system, Equation 6 representing the k-space data then becomes $$M(k_\rho) = s_\delta(k_\rho) e^{-i\Delta\omega_0 \frac{k_\rho}{\gamma G_0}} = 1, \quad [9]$$

which would give the desired impulse response of FIG. 7A. Even if this modulation is done, other regions of the image may still be blurred because those regions are at different resonant frequencies.

If a particular region of an image is of interest, then this region can be placed in focus by carefully modulating and reconstructing the image iteratively until that region is no longer blurred. If a map of the local resonant frequency is available, the image can be reconstructed so that entire image is unblurred using either a "conjugate phase" reconstruction in either a continuous or time-segmented formulation.

The invention provides a reconstruction method in which images are reconstructed without using a frequency map such that the entire image is unblurred.

This is accomplished by selecting for inclusion the least blurred regions of those base images as determined by processing algorithms. Specifically, for each point in the composite image, we choose for inclusion the base image that best satisfies some focusing criterion at that point.

We now examine this criterion for the case of non-2DFT MR imaging. From Equation 6, we observe that for an off-resonant receiver, the desired k-space function is corrupted with a phase term that varies across k space, which is responsible for the image blur. For the generalized case of non-2DFT imaging, this phase function is $-\Delta\omega_0 t(k_x,k_y)$, where $\Delta\omega_0$ is the off-resonance and $t(k_x,k_y)$ the collection time associated with each k-space location. Letting $I(x,y;\Delta\omega_0)$ be the image reconstructed with off-resonance $\Delta\omega_0$ and $M_0(k_x,k_y)$ be the desired, on-resonance k-space function, then the criterion is the maximization of:

$$\iint |I(x,y;\Delta\omega_0)|^2 dxdy = \iint |M_0(k_x,k_y)e^{-i\Delta\omega_0 t(k_x,k_y)}|^2 dk_x dk_y \quad [10]$$
$$= \iint |M_0(k_x,k_y)|^2 dk_x dk_y, \quad [11]$$

by invoking Parseval's theorem. Equation 11 is independent of $\Delta\omega_0$, so clearly the correct receiver or modulation frequency cannot be selected by examining this function. This criterion works for the astronomy and consumer optics applications because these are incoherent optical systems, while the blurring we encounter in this specific case in MRI is analogous to a coherent optical system. A criterion applied to ultrasound imaging, which is also a coherent system, is equivalent to the integral of the fourth power of the image magnitude. This function works in phased-array ultrasound because the desired array aperture is real and positive, but k space, which is the equivalent in MRI to the aperture, is not a real function for general objects.

These and other focusing criteria are functions of the magnitude of the image and do not take advantage of the inherent complex nature of MR images. We therefore propose focusing criteria that use functions of either the phase image or the complex image. One possible criterion here is to minimize the integral of some non-linear function of the imaginary part of the image, for example:

$$\iint |Imag\{I(x,y;\Delta\omega_0)\}|^\alpha dxdy=0 \quad [12]$$

where $\alpha$ might take on values of $\frac{1}{2}$ to 2, and clearly, the criterion is satisfied when the integral is at its minimum, zero. Minimization of the imaginary part of MR images has also been suggested in a method to estimate phase variations across an image for noise reduction. As a practical consideration, some incidental constant and low frequency phase shifts must be removed before applying this criterion. These phase shifts include residual phase from excitation, phase accrual due to inhomogeneity before the first sample such as the $e^{-i\Delta\omega_0 t_0}$ term in Equation 6, flow, gradient eddy currents, and other sources. Because the local resonant frequency varies spatially, the criterion should only act on a region immediately surrounding the point of interest, and therefore, the integration is performed only over a small area centered at that point. The size of this area must be chosen so that it is small enough to vary with the changes in resonant frequency, but large enough to encompass most of the blurred impulse response.

Figure 8:
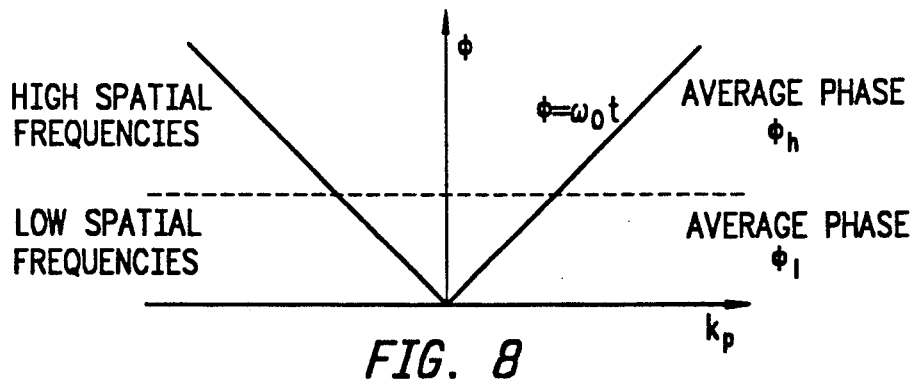
FIG. 8 is a graph illustrating phase accrual in k-space.

In the example of the idealized projection reconstruction system, the phase due to inhomogeneity accrues as data collection proceeds outward in k space as shown in Equation 6. In general, the average phase of the low spatial frequencies will consequently be different from the high spatial frequencies as demonstrated in FIG. 8. If the receiver is on-resonance, that is, $\Delta\omega_0=0$, then no phase accrues and the average phase of the low and high spatial frequency parts will be the same. Spiraling trajectories and practical projection-reconstruction systems will show the same general trends with phase accruing from the center towards the edges of k space, though the specifics of the phase accrual will be different.

Specifically, we decompose the reconstructed image into low and high frequency components:

$$I(x,y;\Delta\omega_0)=l(x,y;\Delta\omega_0)e^{i\phi_l(x,y;\Delta\omega_0)}+h(x,y;\Delta\omega_0)e^{i\phi_h(x,y;\Delta\omega_0)} \quad [13]$$

where $he^{i\phi_h}$ and $le^{i\phi_l}$ are the complex representations of the low and high spatial frequency components of the image, respectively. The low spatial frequency component can then be used as a phase reference to remove the incidental phase variations. The focusing criterion will then be:

$$\iint_A |Imag\{I(x,y;\Delta\omega_0)e^{-i\phi_l(x,y;\Delta\omega_0)}\}|^\alpha dxdy=0, \quad [14]$$

where A is area of integration surrounding the point of interest. Equation 14 can be shown to be equal to:

$$\int\int_A |h(x,y;\Delta\omega_0)\sin(\phi_h(x,y;\Delta\omega_0) - \phi_I(x,y;\Delta\omega_0))|^\alpha dx\,dy = 0. \quad [15]$$

As stated, if the reconstruction is on-resonance, then no phase accrues over the region of integration causing $\phi_h(x,y;\Delta\omega_0) = \phi_I(x,y;\Delta\omega_0)$ and the above expression to be at its minimum, zero. Also, if the reconstruction is off-resonance, then $\phi_h(x,y;\Delta\omega_0) \neq \phi_I(x,y;\Delta\omega_0)$ due to phase accrual and the above expression for the focusing criterion will be non-zero. So by examining this criterion over some small local area, the correct reconstruction frequency can be selected for each point in the image.

Both constant and low frequency phase terms are removed in the above criterion. However, it may be possible to construct a criterion removing only a constant phase term. This can be done if phase is a function of local resonant frequency only, that is, the phase term is a constant for every object point at a particular frequency. Removal of this constant phase can be done by calculating the phase response of the excitation pulse and the phase accrual before the first sample for various receive frequencies. If the receiver is on-resonance for a particular point, then the entire signal should be in the real part; otherwise, some spatial frequencies will be out of phase.

Figure 9:
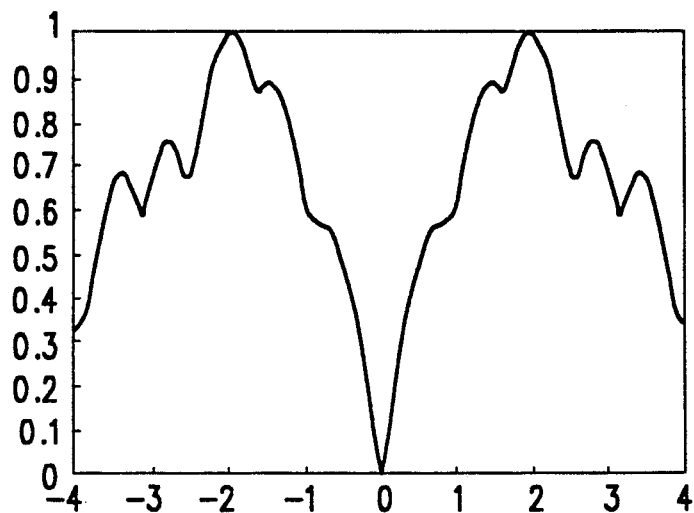
FIG. 9 is a graph illustrating sample response of focusing criterion to varying degrees of off-resonance.

For a better understanding of the implementation considerations, we examine the response of the criterion of Equation 14 to an impulse object. Because the criterion is non-linear in $I(x,y;\Delta\omega_0)$ the true response of the criterion is not a superposition of these curves, however, the general considerations can still be understood by examining this response. FIG. 9 contains the response of the criterion to an impulse object for varying degrees of off-resonance with the idealized projection reconstruction system, as described. The criterion in this example uses an integration size of $7\times 7$ and $\alpha = \frac{1}{2}$, and the off-resonance is normalized to units of $1/(2\pi T)$, where T is the length of the data acquisition window. In this figure, the minimum occurs on-resonance ($\Delta\omega_0 = 0$), which identifies the desired reconstruction frequency.

Since each frequency of reconstruction is essentially a sample point on this curve, these frequencies should be spaced closely enough so that at least one sample will always fall near to the minimum. We can also see from this figure, that the value of the integral decreases as the reconstruction frequency gets far off resonance. The range of frequencies to be examined, therefore, should be limited so the desired minima can be found in the presence of noise and other imperfections. Also, the presence of two overlying or nearby species with different chemical shifts will cause the desired minimum to be corrupted. Conceptually, chemical shift can be viewed as a lateral shift of the above curve in FIG. 9 and therefore, the minima for the two species will not align and the desired minimum may not be found. This, for example, can cause performance degradation when applied to parts of the body with lipids, so this technique should be used in combination with some form of lipid suppression or in parts of the body having few lipids, such as the lungs. Another consideration is selection of the integration area, A, which must be carefully chosen so that it is large enough to encompass most of the blurred impulse response, large enough to be immune to noise, but small enough to track variations in the inhomogeneity.

The computing resources must also be considered in the implementation of the deblurring algorithm. To minimize the memory requirements of the computer program, the algorithm is implemented so that the base images never exist simultaneously in the computer's memory. Here, a base image, $I(x,y;\Delta\omega_i)$, is reconstructed and the focusing measure:

$$S_i(x,y) = \int\int_{A(x,y)} |Imag\{I(x',y';\Delta\omega_i)e^{-i\phi_I(x',y';\Delta\omega_i)}\}|^\alpha dx'\,dy', \quad [16]$$

is calculated, where $A(x,y)$ is the integration area centered at $(x,y)$. Before calculating the next base image, the current best values of the focusing measure and the output image, $S_{best}(x,y)$ and $I_{out}(x,y)$, respectively, are updated. A flow diagram of this processing algorithm is given in FIG. 5, with the box labeled "Update $I_{out}(x,y)$ and $S_{best}(x,y)$" described in more detail in FIG. 6. At the stage where the current best values of the focusing measure and the output image are updated, the value of the frequency that best satisfies the focusing criterion can be stored. This array of frequencies, $\Delta\omega_{out}(x,y)$, is essentially a map of the local resonant frequency as determined by the processing algorithm and can be used to verify performance if an actual frequency map exists.

Figure 10:
FIG. 10 illustrates a pulse sequence for projection reconstruction with short echo time imaging.
Figure 10:
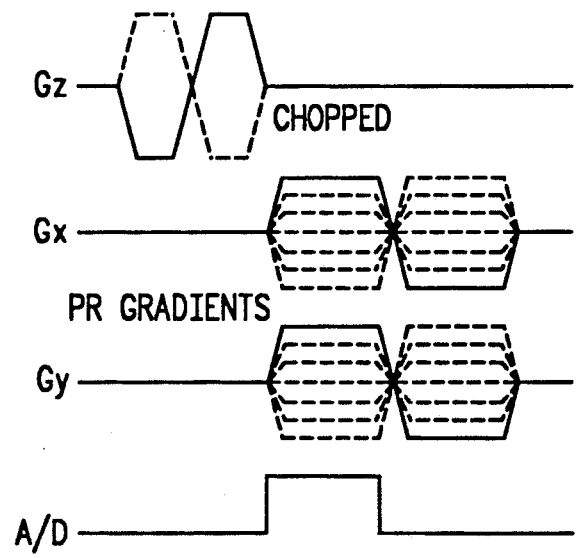

The automatic de-blurring method has been applied to data collected with a projection reconstruction imaging sequence with FID readouts. The pulse sequence that was used is found in FIG. 10. This sequence requires two excitations using half-sinc excitation pulses to achieve the desired profile with no refocusing of the slice select gradient required. This, in conjunction with the FID readouts, allows echo times as short as 250 $\mu$s. These short echo times are useful for the imaging of short-$T_2$ species and flow. Additionally, projection reconstruction sequences have excellent robustness to the effects of induced motion artifacts. The following images were acquired on a GE Signa 1.5T system with shielded gradients, standard gradient amplifiers and a 50 kHz bandwidth A/D filter.

Figure 11:
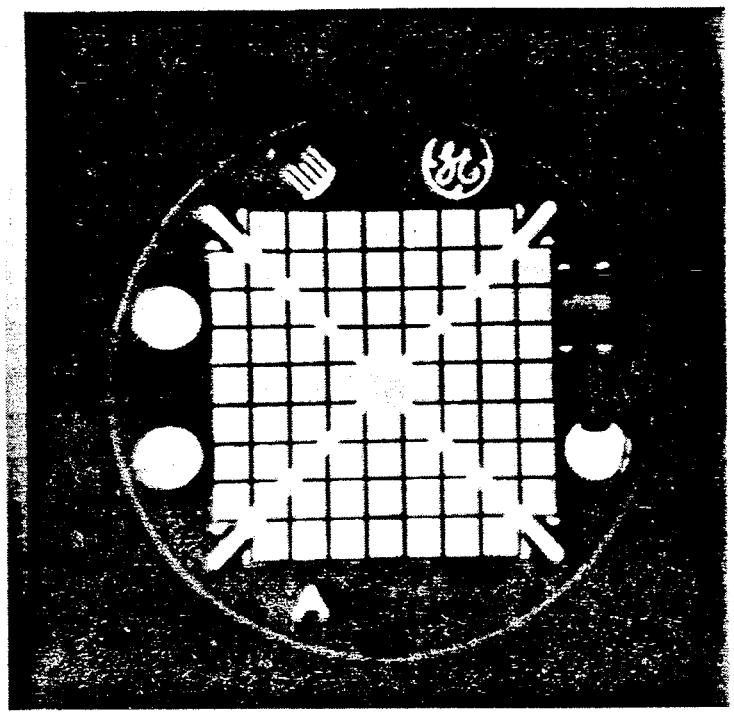
FIG. 11 illustrates a projection reconstruction of a phantom with ±30 Hz inhomogeneity.
Figure 12A:
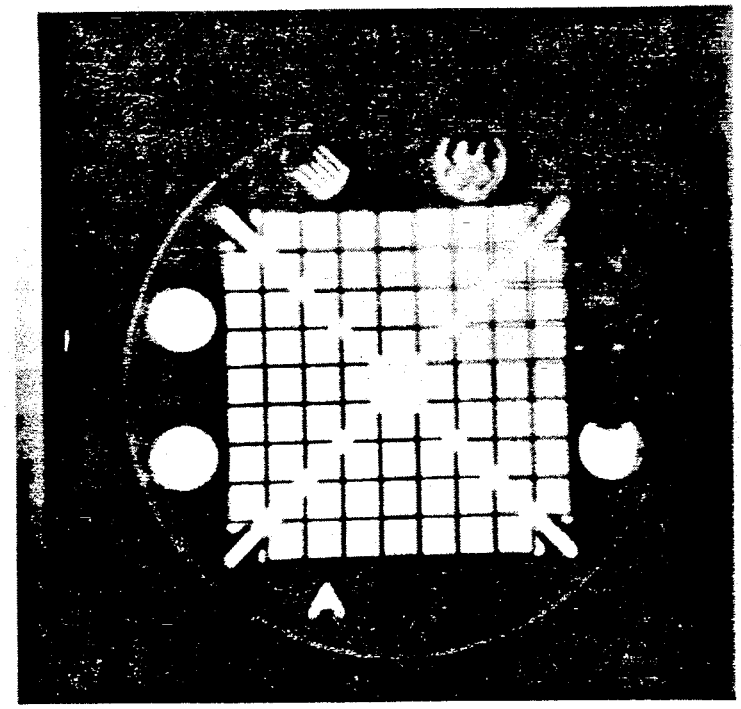
FIGS. 12A–12E illustrate projection reconstructions of the phantom of FIG. 11 under different conditions.
Figure 12B:
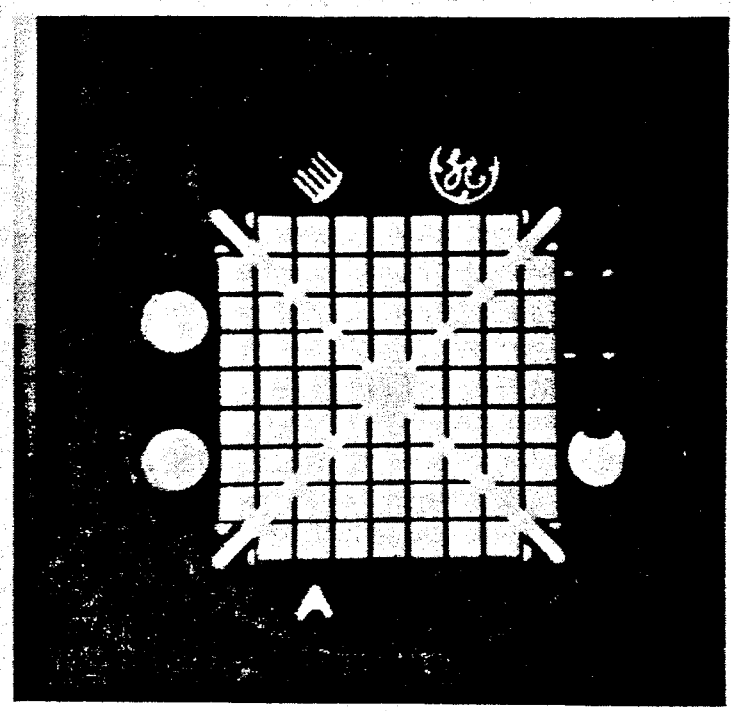
Figure 12C:
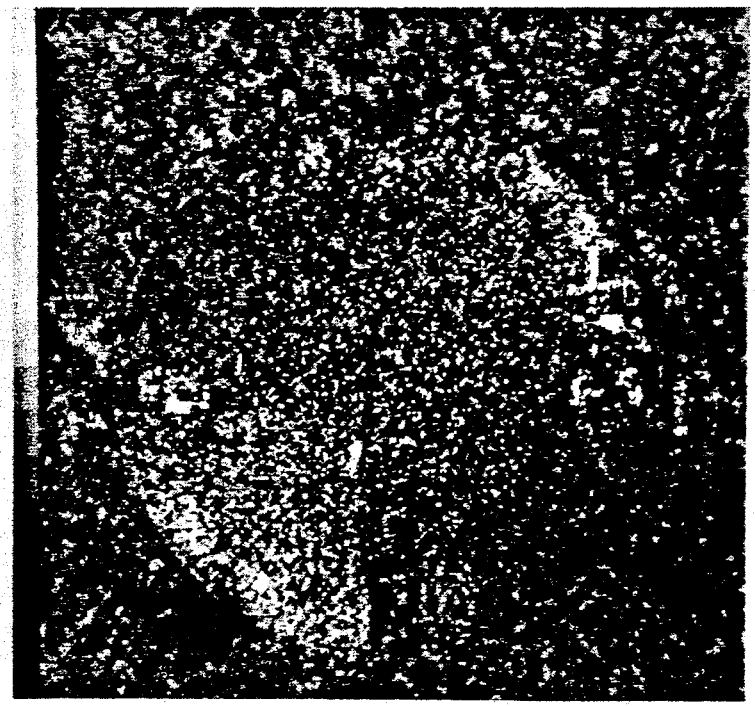
Figure 12D:
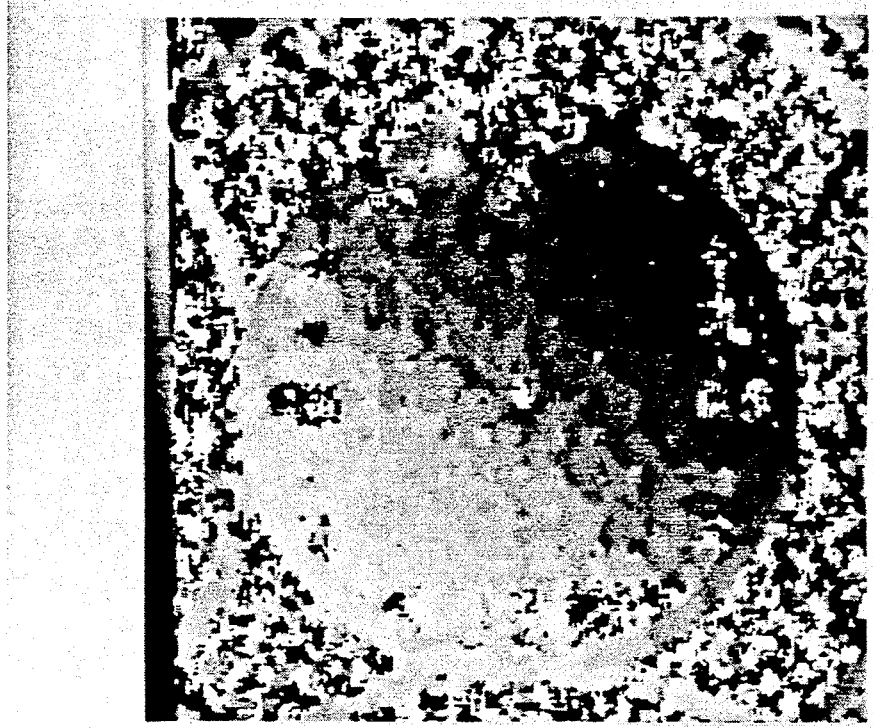
Figure 12E:
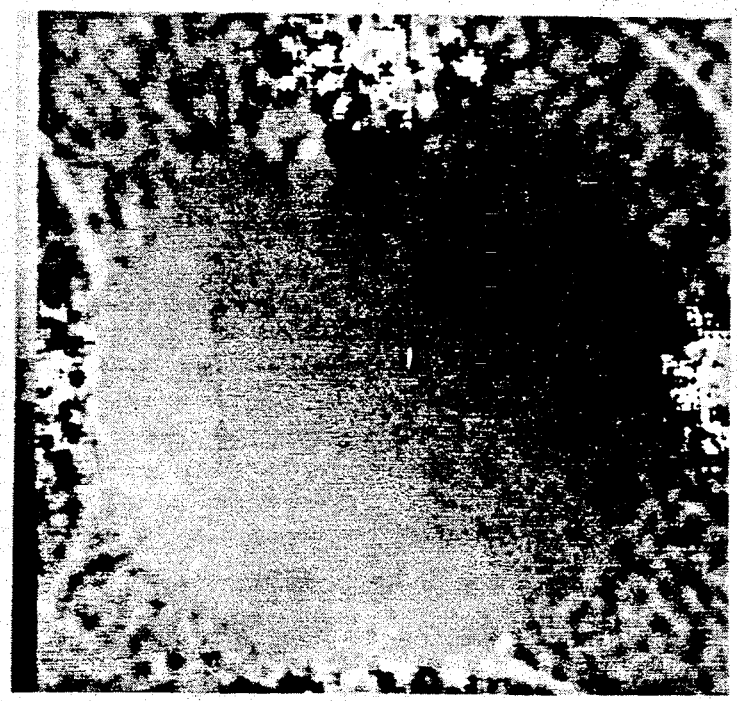

The projection-reconstruction images shown here use 512 radial lines in k space with a usable acquisition window of $T \approx 2$ ms. The images are reconstructed using bi-linear interpolation with 2D-FFT, each having $256\times 256$ voxels over a 20 cm field of view (FOV). A reference image of a resolution phantom with a well shimmed magnet ($\pm 30$ Hz) and an echo time of 250 $\mu$s was acquired and is found in FIG. 11. For illustrative purposes, inhomogeneity is added to the system by modifying the x and y linear shim channels so that the new inhomogeneity is $+200$ to $-400$ Hz, and the resultant image is found in FIG. 12A. The homogeneity correction method was applied using base images reconstructed from data modulated at 50 Hz intervals from $+200$ to $-400$ Hz using a local area for integration of $7\times 7$ pixels. The homogeneity corrected image is found in FIG. 12B, and for comparison purposes, the image containing the difference of FIG. 12B and FIG. 11 is found in FIG. 12C. The difference image, which was windowed to 1/5 of the window level of the original image, shows very little loss of resolution, but does contain some low frequency shading due to the off-resonance behavior of the half-sinc excitation pulse. FIGS. 12D and 12E contain maps of resonant frequencies as determined by the processing algorithm and by a field measurement protocol, respectively. These maps verify that in regions of the image where there is edge information, the de-blurring algorithm correctly chooses the correct resonant frequency and in regions with no edge information and for which the reconstruction frequency has little effect on the image appearance the algorithm chooses arbitrary frequencies.

Figure 13A:
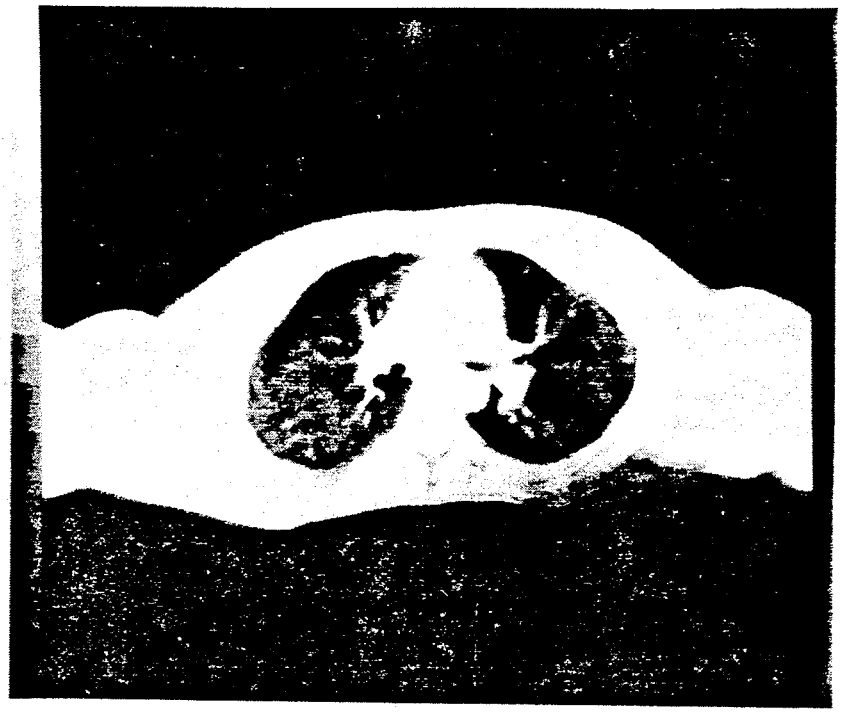
FIGS. 13A, 13B are projection reconstruction images of lungs without image deblurring and with deblurring.
Figure 13B:
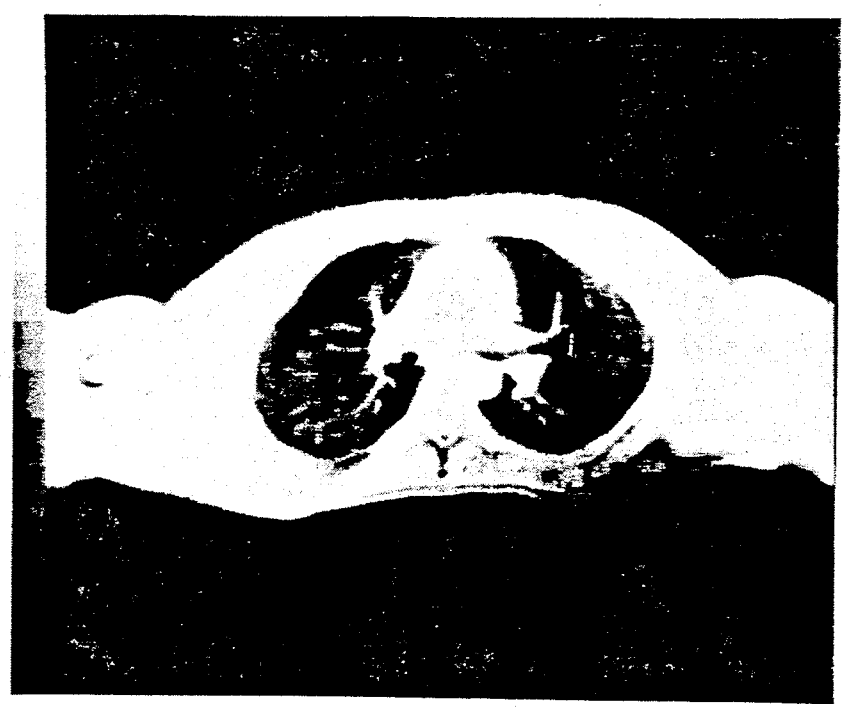

This method was also applied to imaging of the lungs of a healthy volunteer using an ungated pulse sequence with a repetition time of 316 ms. FIGS. 13A and 13B contains images of the lungs over a 48 cm field-of-view before and after correction by the described method. Blur has been reduced for the fine structure and vessels in the posterior portion of the lungs where there are large susceptibility shifts.

Figure 14:
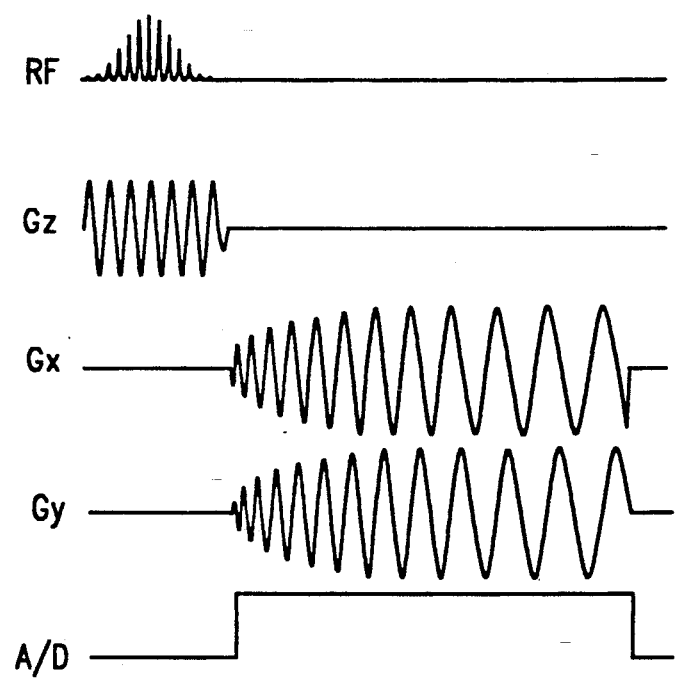
FIG. 14 illustrates a pulse sequence for spiral scan imaging.

The homogeneity correction algorithm has also been applied to spiral trajectory fast scanning using a gridding reconstruction. This imaging sequence uses only 8 interleaves with no averaging in a cardiac-gated image of the abdomen. The pulse sequence is found in FIG. 14 and uses a simultaneously spectrally and spatially selective excitation pulse for slice and water component selection. The readout window is T=41 ms and the effective matrix of the reconstructed image is 190×190 over a 36 cm FOV.

Figure 15A:
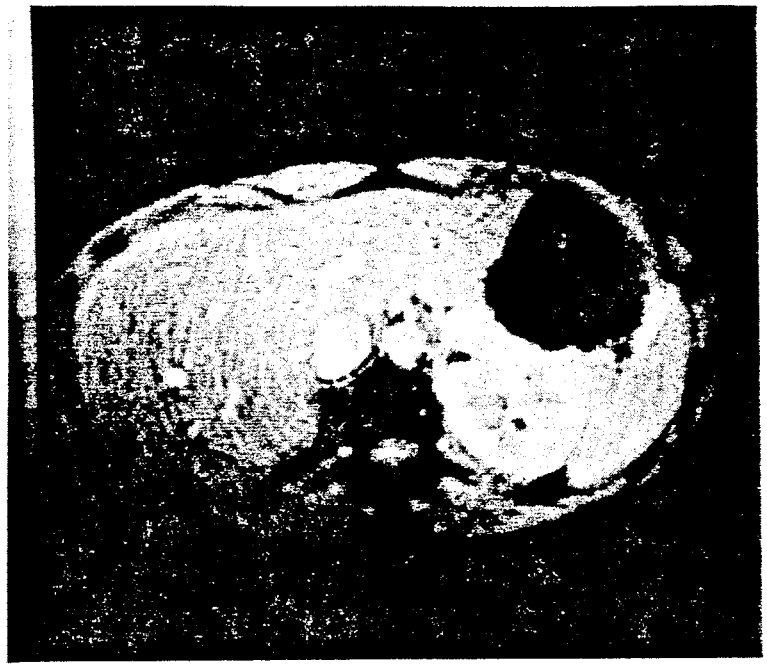
FIGS. 15A, 15B illustrate spiral scan images of the abdomen with no deburring and with deburring, respectively.
Figure 15B:

Images of the abdomen before and after de-blurring by the above method are found in FIGS. 15A and 15B. Blur reduction occurs near the major vessels and the spine as well as other areas in the abdomen. The de-blurring method was implemented by modulating the data in 5 Hz increments over a ±50 Hz range of frequencies and the local area of integration was 21×21 pixels. This large area was made necessary by the large degree of blur encountered in this example.

In summary, blur due to off resonance reconstruction is removed by automatic processing algorithms and does not require the use of a map of the local resonant frequencies. A series of base images are reconstructed after modulating the raw data to different frequencies. In each of these base images a focusing measure is calculated to determine what regions are in focus and what regions are blurred. Finally, an unblurred composite image is created using only the unblurred regions of the base images. The method has successfully been applied to phantom and in vivo images for projection-reconstruction and spiral trajectory imaging methods.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of enhancing the focus of a magnetic resonance image (MRI) of a body comprising:
    (a) placing a body in a magnetic field ($B_0$),
    (b) applying a RF excitation pulse ($B_1$) to said body,
    (c) detecting resultant signals from said body,
    (d) demodulating said resultant signals at a plurality of frequencies to obtain MRI signals $I_f(x,y)$,
    (e) applying a focusing criterion to said MRI signals to obtain focusing measures $S_f(x,y)$,
    (f) comparing said focusing measures for said MRI signals at said plurality of frequencies, and
    (g) selecting an MRI signal based on said focusing measures.

2. The method as defined by claim 1 wherein step (c) detects said resultant signals as specific points, and step (e) compares said MRI signals to focusing criterion at said specific points.

3. The method as defined in claim 2 wherein said MRI signals are complex signals having real and imaginary parts and said focusing criterion is minimization of a mathematical function of the imaginary parts of said MRI signals.

4. The method as defined by claim 3 wherein steps (d), (e), and (f) are performed iteratively.

5. The method as defined by claim 4 wherein said focusing criterion is iteratively updated.

6. The method as defined by claim 5 wherein said MRI signals are separated into low spatial- frequencies and high spatial frequencies, and steps (e) and (f) are carried on said high spatial frequencies.

7. The method as defined by claim 1 wherein step (e) includes converting said MRI signals to images.

8. The method as defined by claim 1 wherein said MRI signals are complex signals having real and imaginary parts and said focusing criterion includes minimization of the imaginary parts of said MRI signals.

9. The method as defined by claim 8 wherein steps (d), (e), and (f) are performed iteratively.

10. The method as defined by claim 9 wherein said focusing criterion is iteratively updated.

11. The method as defined by claim 1 wherein said MRI signals are separated into low spatial frequencies and high spatial frequencies, and steps (e) and (f) are carried out on said high spatial frequencies.

12. The method as defined by claim 1 wherein a composite MRI is provided using selected MRI signals for a plurality of parts of a total image.

13. The method as defined by claim 1 wherein a composite MRI is provided using selected MRI signals for a plurality of points in a total image.

14. A method of enhancing the focus of a composite magnetic resonance image (MRI) of a body comprising:
    (a) detecting signals emitted from a plurality of parts in said composite MRI in response to magnetic stimulation, said signals having a Larmor frequency depending on the magnetic field through said parts and the magnetogyric ratio for nuclei in said parts,
    (b) selecting a plurality of frequencies for the Larmor frequency,
    (c) determining MRI signals for each of said plurality of frequencies in each part,
    (d) comparing said MRI signals from each part using a focusing criterion,
    (e) selecting an optimum MRI signal for each of said selected parts based on said focusing criterion, and
    (f) forming said composite MRI of said body based on the selected optimum MRI signals for said selected parts.

15. The method as defined by claim 14 wherein step (d) includes converting said MRI signals to images and said focusing criterion is an image.

16. The method as defined by claim 14 wherein each part comprises a point in said composite MRI.

17. Apparatus for obtaining magnetic resonance image (MRI) signals for a body comprising:
    (a) means for generating a magnetic field ($B_0$) through said body,
    (b) means for applying a RF pulse ($B_1$) to said body,
    (c) means for detecting resultant signals from said body,
    (d) means for demodulating the detected signals at a plurality of frequencies to obtain MRI signals,
    (e) means for applying a focusing criterion to said MRI signals to obtain focusing measures $S_f(x,y)$, (f) means for comparing said focusing measures for said MRI signals at said plurality of frequencies, and (g) means for selecting an MRI signal based on said focusing measures.

18. Apparatus as defined by claim 17 wherein said means for comparing converts said MRI signals to images before comparing said MRI signals to a focusing criterion.

19. Apparatus as defined by claim 17 wherein said MRI signals are complex signals having real and imaginary parts and said focusing criterion includes minimization of the imaginary parts of said MRI signals.

* * * * *